United States Patent [19]

Todokoro et al.

[11] 4,355,232
[45] Oct. 19, 1982

[54] APPARATUS FOR MEASURING SPECIMEN POTENTIAL IN ELECTRON MICROSCOPE

[75] Inventors: Hideo Todokoro, Hinodemachi; Satoru Fukuhara, Kokubunji; Yoshio Sakitani, Ohimachi, all of Japan

[73] Assignee: Hitachi, Ltd., Tokyo, Japan

[21] Appl. No.: 152,843

[22] Filed: May 23, 1980

[30] Foreign Application Priority Data

May 28, 1979 [JP] Japan .................... 54-65029

[51] Int. Cl.³ .................... G01N 23/00; H01J 37/00
[52] U.S. Cl. .................... 250/310
[58] Field of Search .............. 250/305, 310, 311, 397

[56] References Cited

U.S. PATENT DOCUMENTS

| | | | |
|---|---|---|---|
| 3,646,344 | 2/1972 | Plows et al. | 250/310 |
| 4,179,604 | 12/1979 | Christon | 250/310 |
| 4,246,479 | 1/1981 | Gopinathan | 250/310 |
| 4,292,519 | 9/1981 | Feuerbaum | 250/310 |

Primary Examiner—Bruce C. Anderson
Attorney, Agent, or Firm—Antonelli, Terry & Wands

[57] ABSTRACT

An apparatus for measuring the specimen potential in an electron microscope includes a first grid arranged to enclose a specimen which is to be irradiated with a primary charged particle beam emitted from the electron source of the electron microscope and to which is supplied a voltage sufficient to attract the secondary electrons emitted from the specimen. A second grid supplied with a voltage sufficient to analyze the energy of the secondary electrons which have passed through the first grid is disposed outside the first grid, and a secondary electron detecting arrangement for detecting the secondary electrons which have passed through the second grid is disposed adjacent the second grid. A current detecting arrangement partly for impressing the voltage upon the first grid and partly for detecting the current flowing through the first grid is provided along with a dividing and amplifying arrangement for dividing the output of the secondary electron detecting arrangement by the output of the current detecting arrangement, whereby the potential at said specimen of the electron microscope is measured with increased sensitivity.

11 Claims, 7 Drawing Figures

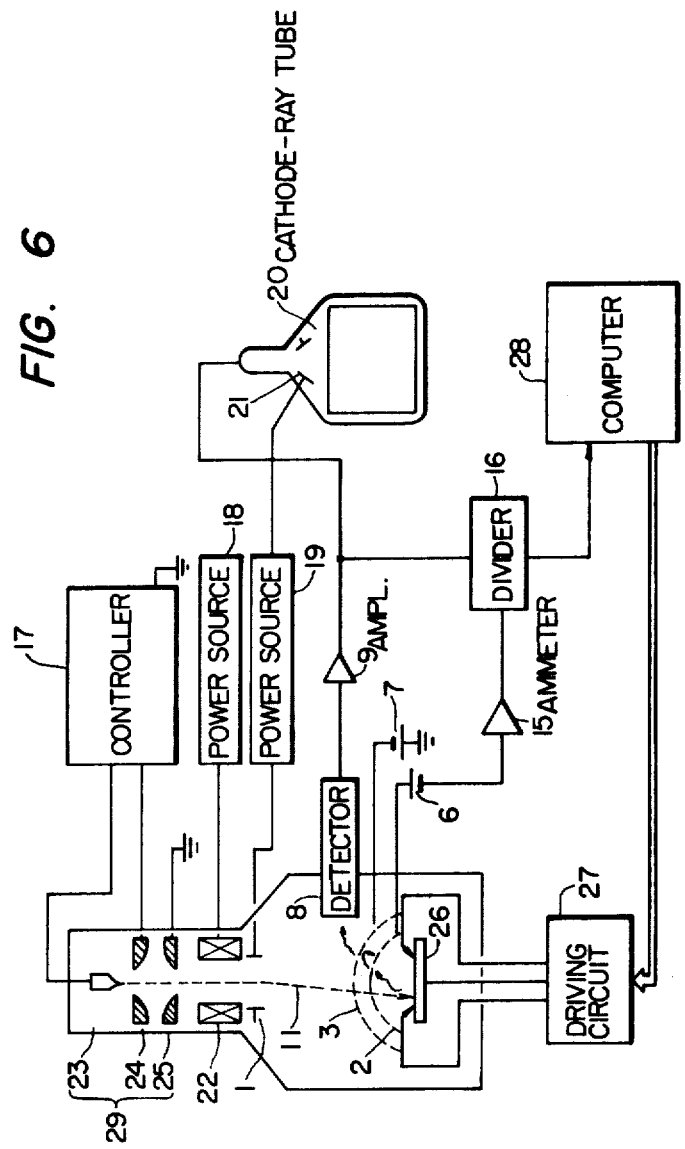

APPARATUS FOR MEASURING SPECIMEN POTENTIAL IN ELECTRON MICROSCOPE

BACKGROUND OF THE INVENTION

The present invention relates to improvements in an apparatus for measuring the potential or potential distribution of a minute specimen or sample in the specimen chamber of an electron microscope, especially, a scanning electron microscope.

If electrons having an energy of several kilovolts impinge upon metal, secondary electrons are emitted. These secondary electrons usually have an energy distribution having a peak at 2 to 3 eV, as shown in FIG. 1A. In the case where the potential of a sample (or target) is zero volts, the energy distribution takes the shape shown in FIG. 1A; however, if the potential of the sample is lowered to several negative volts, the distribution is shifted rightwardly to take the shape shown in FIG. 1B. This shift in the peak is equal to the change in the potential of the sample.

If these characteristics are used, an unknown sample potential can be determined by measuring the energy distribution. On principle, to accomplish this, the shift in the peak has to be measured, and a method for accomplishing the measurements with the use of a retarding type energy analyzer has been widely used for simplicity. This retarding type energy analyzer is of the type in which signals proportional to the hatched areas (a) and (b) shown in FIGS. 1A and 1B are generated. As already described, these hatched areas change with changes in the specimen potential; thus, the specimen potential can be measured in terms of that change.

FIG. 2 is a diagrammatical view showing the construction of a potential measuring system using a retarding type energy analyzer in accordance with a prior system (Reference should be made to "Scanning Electron Microscope", 1978, Vol. 1, page 375, IITRI). A specimen 4 is irradiated with an electron beam 11. This electron beam 11 can be directed to any point on the specimen 4 by the action of a deflector 1. An unknown voltage 5 is applied to that specimen 4, which voltage is to be measured in terms of the secondary electrons generated from the specimen. The secondary electrons 13 emitted from the specimen 4 are accelerated by a first grid 2 so that most of them can pass through the first grid. This first grid is supplied with a voltage 6 at a level in the range of +10 to +100 volts, for example. On the other hand, a second grid 3 is supplied with a voltage 7 at a level such as −5 volts. Thus, only those secondary electrons 12 among the secondary electrons 14 which have passed through the first grid 2, and which have an energy higher than about 5 eV, can pass through the second grid. The secondary electrons 12 which have passed through the second grid are detected by means of a secondary electron detector 8. This secondary electron detector 8 has a light guide, to the leading end of which a scintillator or phosphor target is attached by means of a support ring. That particular portion is supplied with a positive potential of about 10 kV through a lead wire. Thus, the secondary electrons are accelerated by the potential of 10 kV to open the scintillator. The resultant light is guided by a light guide into a photomultiplier, where it is detected. The output of that secondary electron detector 8 corresponds to the hatched portion of FIG. 1. When the voltage 5 is lowered to assume a negative level, the output of the secondary electron detector is increased for reasons indicated in conjunction with FIGS. 1A and 1B. The output thus increased is amplified by an amplifier 9 and is recorded in a recorder 10 or the like.

The system thus-far described is simple and convenient, but it has various drawbacks. More specifically, since the output is dependent upon the irradiation of the electron beam, a fluctuation in the irradiation, if any, would invite corresponding errors in the measurement so that the precision of the measurement will be deteriorated thereby. In this regard, an increase in the total number of secondary electrons emitted from the specimen as a result of increase in the irradiation of the electron beam will produce a rise in the characteristic curve of FIG. 1A and give the appearance of an increase, in the output insofar as the size of the hatched area is concerned. Thus, with the prior system the detector will not be able to distinguish signal changes caused by changes in beam irradiation from changes caused by variation of that specimen potential.

SUMMARY OF THE INVENTION

In view of the points thus-far described, therefore, it is an object of the present invention to provide an apparatus for measuring specimen potential in an electron microscope, which apparatus succeeds in solving the problem resulting from fluctuation in the irradiation and in improving the sensitivity of the measurement of changes in the specimen potential so that the accuracy in the measurement can be improved.

In order to attain the aforementioned object, according to the present invention, there is provided an apparatus for measuring specimen potential in an electron microscope, which apparatus comprises: first grid means arranged to enclose a specimen, which is to be irradiated with a primary charged particle beam emitted from the electron source of an electron microscope, and supplied with such a voltage as to attract the secondary electrons emitted from said specimen; second grid means supplied with such a voltage as to analyze the energy of the secondary electrons having passed through the first-named grid means; secondary electron detecting means for detecting the secondary electrons having passed through the second-named grid means; current detecting means partly for impressing said voltage upon the first-named grid means and partly for detecting the current flowing through the first-named grid means; and dividing and amplifying means for dividing the output of said secondary electron detecting means by the output of said current detecting means, whereby the potential at said specimen of said electron microscope is measured.

BRIEF DESCRIPTION OF THE DRAWINGS

FIG. 6 is a diagrammatical view showing an embodiment, in which the present invention is applied to a scanning type electron microscope.

DETAILED DESCRIPTION OF THE PREFERRED EMBODIMENTS

The present invention will now be described in connection with exemplary embodiments thereof.

Figure 3:
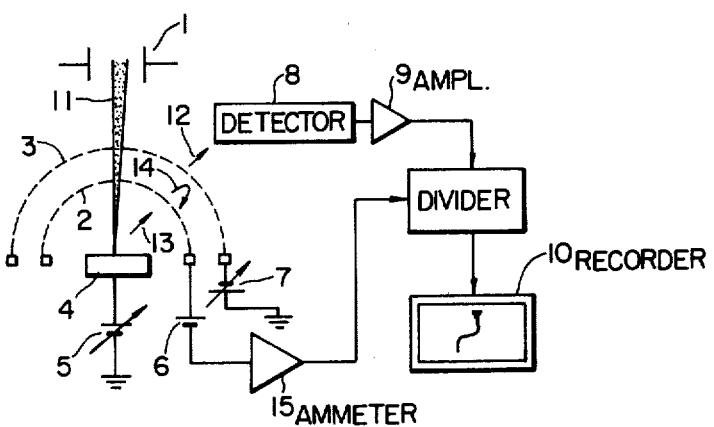
FIG. 3 is a diagrammatical view showing one embodiment of the present invention.

FIG. 3 shows one embodiment of the present invention. The specimen 4 is irradiated at any point with the electrom beam 11 as selected by the action of the deflector 1. Let it be assumed that the specimen 4 is supplied with an unknown voltage 5. In the measurement under consideration, that unknown voltage 5 is to be measured.

Figure 1A:
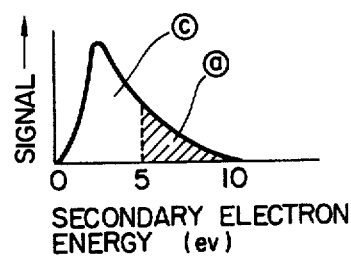
FIG. 1A is a graph showing a characteristic curve of the energy distribution of the secondary electrons which are emitted when a specimen is irradiated with electrons in case the potential of the specimen is at zero volt.
Figure 1B:
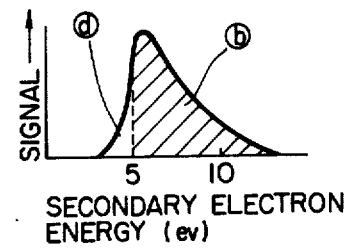
FIG. 1B is a graph showing a characteristic curve of the energy distribution of the secondary electrons which are emitted when a specimen is irradiated with electrons in case the potential of the specimen is several volts negative.

The secondary electrons emitted from the specimen 4 are attracted by the first grid 2. This grid 2 is supplied with a voltage 6 which is, e.g., about 20 volts higher than the voltage 7 applied to the second grid 3. Those secondary electrons 14 which have passed through the first grid 2, and which have relatively low energies, are repulsed by the inverse voltage 7, which is applied to the second grid 3, and these low energy recording electrons fall back on the grid 2. The secondary electrons 12 which have passed through the second grid 2 are detected by the secondary electron detector 8, e.g., an Evahart type secondary electron detector. On the other hand, at the same time the first grid 2 is supplied with the voltage 6, the current flowing through the first grid 2 is detected by a detector, e.g., an electron ammeter 15. Both the output of the secondary electron detector 8 and the output of the electron ammeter 15 are fed to a divider circuit 16, from which a signal corresponding to the ratio of the two inputs is generated. More specifically, the output of the secondary electron detector 8 is divided by the output of the ammeter 15. This calculation means that the area ⓐ is divided by the area ⓒ or that the are ⓑ is divided by the area ⓓ, as seen from FIG. 1.

In this way, with the output of the amplifier 9 being fed to the numerator input of the divider 16 and the output of the ammeter 15 being fed to the denominator input of the divider 16, the division of these inputs is effected and the divided value is fed to the recorder 10 or the like. As a result, it is possible (1) to remarkably reduce the influence on the measurement of fluctuation in the electron irradiation and (2) to remarkably improve the sensitivity of the measurement since the detection of the hatched area of the characteristic curve is effected on the basis of its relationship to the unhatched area. Thus, the measurement takes into account the total quantity of secondary electrons emitted from the specimen, thereby eliminating any effects of changes in beam irradiation.

In the embodiment thus far described, it is preferred that the voltage 6 to be applied to the first grid 2 be higher than 10 volts as a practical matter and that the voltage 7 to be applied to the second grid 3 be in the range of $-10$ to 0 volts.

The effects obtainable according to the present invention will be described in the following.

Figure 2:
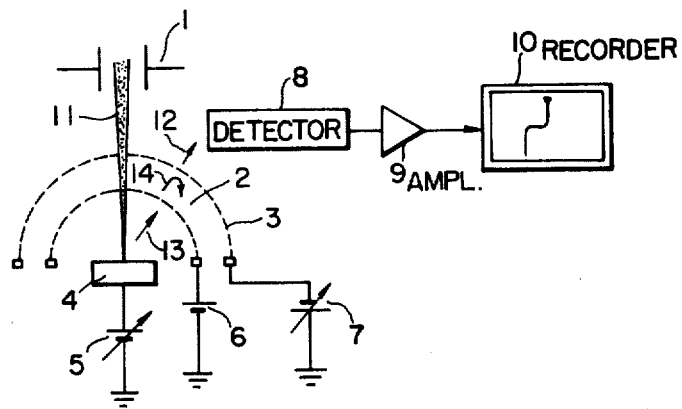
FIG. 2 is a diagrammatical view illustrating a prior potential measuring system.
Figure 4:
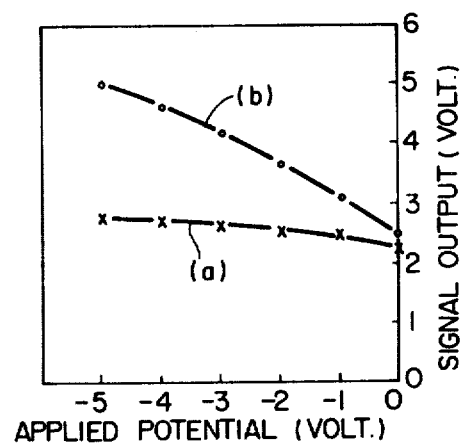
FIG. 4 is a graph showing characteristic curves for illustrating the effects in sensitivity according to the present invention.

FIG. 4 compares the sensitivities obtainable by the system (a) according to FIG. 2 and by the system (b) according to the present invention. The curves plotted illustrate the changes in the outputs when the specimen voltage 5 is changed from 0 to $-5$ V while holding the second grid at $-3$ volts. It is found that the curve (b) according to the present invention has a steeper gradient than that of a curve (a) according to the prior system. More specifically, the gradient when the specimen voltage is 0 volts takes 0.2 for the prior system (a) but 0.65 for the present invention (b), which means that the present invention can enjoy a sensitivity about three times higher than that of the prior system.

Figure 5:
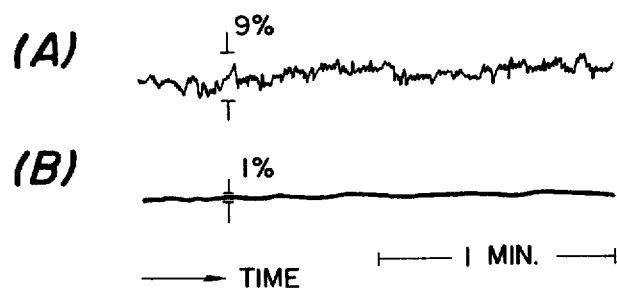
FIG. 5 is a graph showing characteristic curves for illustrating the effects in the fluctuations of an electron beam according to the present invention.

On the other hand, FIG. 5 shows the effects in the fluctuations in the irradiation of the electron beam.

The upper curve is obtained according to the prior art system (A), in which the fluctuations in the electron current directly lead to fluctuations in the output. These fluctuations are obtained with the use of a field emission type scanning electron microscope and are greater than those obtained with the use of the usual thermionic emission electron gun. Since, however, this electron gun is featured by the fact that it is capable of obtaining a high spacial resolution, it is generally used. The fluctuations of as high as 9% according to the prior system (A) are attenuated to only 1% according to the present invention (B). Thus, it is possible to determine the minimum voltage level that can be detected from the sensitivity and the stability in the electron current. In this instance, the minimum voltage level is 1.5 V according to the prior system (A) but 0.03 V according to the present invention (B). Therefore, the minimum voltage level according to the present invention is reduced to 1/50 of that according to the prior system.

FIG. 6 shows an embodiment in which the present invention is applied to a scanning type electron microscope (SEM). In FIG. 6, the same reference numbers as those of FIG. 3 indicate like parts or elements. A field emission type electron gun 29 is used as a source for electrons. This field emission type electron gun 29 is constructed to include a tip 23, a first anode 24 and a second anode 25 and is operated by a controller 17 in the well-known manner. The energy of the typical electron beam 11 is 1 kV. This electron beam 11 is focused upon a specimen (e.g., an LSI) 26 by the action of a focusing coil 22, which is connected with a controllable power source 18. The electron beam 11 is controlled by scanning signals from a power source 19 applied to the deflector 1 thereby to scan the specimen 26 in the well-known manner. A cathode ray tube 20 has its deflector 21 energized from the power source 19 and so that the beam therein is synchronized with the operation of the deflector 1. The brightness of the cathode ray tube 20 is modulated by the output of the amplifier 9, i.e., by the output of the secondary electron detector 8. This is the construction of the so-called scanning type electron microscope. Thus, the image of the specimen 26 is observed so that the electron beam 11 is fixed at a special position to be measured. This function is delegated to the scanning power source 19.

Upon effecting the measurement, the output of the divider 16 is read out. In this instance, the LSI (or specimen) 26 is operated by a driving circuit 27, and the corresponding output is read out. This reading operation is accomplished by a micro-computer 28. The timing or the like for the reading operation is performed by making the microcomputer 28 and the driving circuit 27 coactive with each other. According to the construction described above, the electron beam is used to scan the special position to be measured so that the potential at that position and/or the potential distribution can be measured.

Incidentally, the present invention can be applied not only to the SEM exemplified in this instance, but also to other electron beam devices for generating secondary electrons. Moreover, the present invention should not be limited to the secondary electron detector mentioned herein in conjunction with the aforementioned exemplary embodiments, but can be modified such that a semispherical collector is disposed around the second grid 3, as shown in FIG. 3, with a view to accomplishing the energy analysis so that the secondary electrons may be detected. In another modification, the second grid may be replaced by the aforementioned collector which functions to detect the secondary electrons and to analyze the energy. Essentially, moreover, the present invention can be applied even if the surface of the specimen is irradiated with the primary charged particle beam so that the electrons of secondary character such as the secondary and/or reflected electrons emitted from the specimen may be detected.

As has been described hereinbefore, according to the present invention, the sensitivity to the change in the specimen voltage and the measuring accuracy are improved independently of the irradiation of the electron beam so that the potential at the specimen of an electron beam device can be measured.

What is claimed is:

1. An apparatus for measuring specimen potential in an electron microscope, comprising: first grid means arranged to at least partially enclose a specimen which is to be irradiated with a primary charged particle beam emitted from the electron source of the electron microscope; means for applying to said first grid means a first voltage sufficient to attract the secondary electrons emitted from said specimen; second grid means disposed on the side of said first grid means opposite said specimen; means for applying to said second grid means a second voltage so as to allow only those secondary electrons that have passed through the first grid means and which have an energy level greater than a selected value to pass through said second grid means; secondary electron detecting means for detecting the secondary electrons which have passed through the second grid means; current detecting means for detecting the current flowing through the first grid means; and dividing means for dividing the output of said secondary electron detecting means by the output of said current detecting means, whereby an output representing the potential at said specimen of said electron microscope is provided.

2. A potential measuring apparatus as set forth in claim 1 wherein the first grid means includes a grid arranged to semispherically enclose said specimen in a manner to attract the secondary electrons emitted from said specimen.

3. A potential measuring apparatus as set forth in claim 2 wherein said second grid means includes a grid arranged semispherically around said first grid means.

4. A potential measuring apparatus as set forth in claim 2 or 3 wherein the first grid means is supplied with a higher voltage than that applied to the second grid means.

5. A potential measuring apparatus as set forth in claim 3 wherein said secondary electron detecting means includes a collector arranged semispherically around the semispherical grid of the second grid means.

6. A potential measuring apparatus as set forth in claim 3 wherein the second grid means and the semispherical collector acting as said secondary electron detecting means are arranged around the semispherical grid of the first grid means.

7. A potential measuring apparatus as set forth in claim 4 further comprising display means connected to the output of said dividing means for displaying the potential at said specimen of said electron microscope.

8. A potential measuring apparatus as set forth in claim 3 wherein the voltage applied to said first grid is higher than 10 volts, and the voltage applied to said second grid is in the range of $-10$ to 0 volts.

9. An apparatus for measuring specimen potential on the basis of detection of secondary electrons emitted from the specimen as a result of irradiation thereof by a charged particle beam, comprising: first means for detecting those secondary electrons emitted from said specimen which have an energy above a predetermined value and for generating a first signal representative thereof; second means for detecting those secondary electrons emitted from said specimen which have an energy below said predetermined value and for generating a second signal representative thereof; and divider means for dividing said first signal by said second signal to produce an output indicative of specimen potential.

10. In an electron microscope in which a specimen is irradiated by a primary charged particle beam so as to emit secondary electrons of different energy levels and including an apparatus for measuring specimen potential on the basis of said secondary electrons, the improvement comprising means for detecting a shifting of the energy distribution of the emitted secondary electrons with changes in specimen potential including means for generating a signal representing the ratio of emitted secondary electrons having an energy above a predetermined level to emitted secondary electrons having an energy below said predetermined level, said generated signal being indicative of specimen potential.

11. Apparatus for measuring specimen potential in an electron microscope, comprising: first grid means arranged to at least partially enclose a specimen which is to be irradiated with a primary charged particle beam emitted from the electron source of the electron microscope; means for applying to said first grid means a first voltage sufficient to attract the secondary electrons emitted from said specimen; second grid means disposed on the side of said first grid means opposite said specimen; means for applying a second voltage to said second grid means to allow only a higher energy portion of the secondary electrons to pass through said second grid means, the remaining secondary electrons of lower energy falling back to said first grid means; secondary electron detecting means for detecting the secondary electrons which have enough energy to pass through the second grid means; current detecting means for detecting the current which flows in the first grid means according to the energy level of the secondary electrons attracted thereto; and dividing means for dividing the output of said secondary electron detecting means by the output of said current detecting means, whereby an output representing the potential at said specimen of said electron microscope is provided.

* * * * *